(12) United States Patent
Lorenz

(10) Patent No.: US 6,336,546 B1
(45) Date of Patent: Jan. 8, 2002

(54) CONVEYING SYSTEM

(75) Inventor: Günter Lorenz, Nürnberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 09/481,639

(22) Filed: Jan. 12, 2000

(30) Foreign Application Priority Data

Jan. 12, 1999 (DE) .......................................... 199 00 804

(51) Int. Cl.$^7$ .............................................. B65G 43/00
(52) U.S. Cl. ..................... 198/346.2; 414/938; 414/940
(58) Field of Search .......................... 198/346.1, 346.2; 414/222, 937, 938, 939, 940

(56) References Cited

U.S. PATENT DOCUMENTS

| | | | | |
|---|---|---|---|---|
| 4,658,947 A | * | 4/1987 | Welder | 198/346.2 |
| 5,443,346 A | | 8/1995 | Murata et al. | 414/222 |
| 5,855,726 A | * | 1/1999 | Soraoka et al. | 414/940 X |
| 5,993,081 A | * | 11/1999 | Itoh et al. | 414/938 X |
| 6,168,002 B1 | * | 1/2001 | Takahashi et al. | 198/346.2 X |

FOREIGN PATENT DOCUMENTS

| | | |
|---|---|---|
| DE | 4017006 A1 | 11/1991 |
| DE | 19729525 A1 | 9/1998 |
| EP | 0908931 A2 | 4/1999 |

OTHER PUBLICATIONS

Japanese Patent Abstract No. 08268512 A (Tatsuo), dated Oct. 15, 1996.
Japanese Patent Abstract No. 09235010 A (Iwao), dated Sep. 9, 1997.
Japanese Patent Abstract No. 10035883 A (Koji et al.), dated Feb. 10, 1998.

* cited by examiner

Primary Examiner—James R. Bidwell
(74) Attorney, Agent, or Firm—Herbert L. Lerner; Laurence A. Greenberg; Werner H. Stemer

(57) ABSTRACT

A conveying system for transporting wafers in clean rooms, the conveying system is configured as a transporting store and connects a plurality of processing centers for processing the wafers. Secondary conveying systems branch off from the conveying system and form supply buffers. In each case one secondary conveying system leads to at least one processing center from which a predetermined number of wafers can be removed, and fed to the processing center, optionally by use of at least one handling unit.

18 Claims, 2 Drawing Sheets

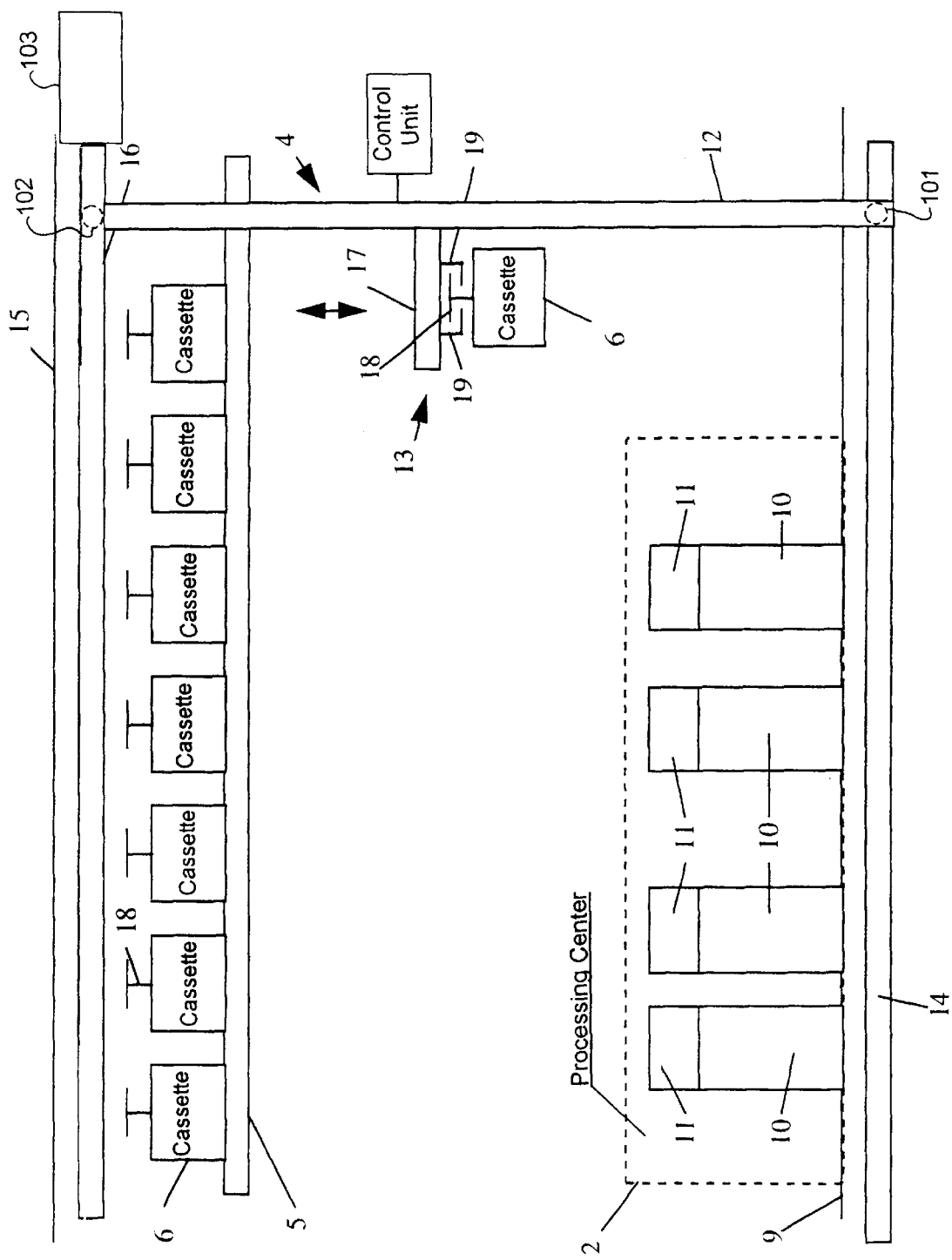

CONVEYING SYSTEM

BACKGROUND OF THE INVENTION

Field of the Invention

The invention relates to a conveying configuration for transporting wafers in clean rooms. The conveying configuration is a transporting store for the wafers and connects a plurality of processing centers for processing the wafers.

Such clean rooms form a constituent part of production facilities for semiconductor products. In particular, the wafers are processed in such production facilities, with the result that the wafers can be used for producing electronic components and the like.

During the processing of such wafers, the purity demands are high, which renders production under clean-room conditions necessary. The process for producing the wafers contains a multiplicity of different processing operations, for example various layer-growing processes, lithography and etching and diffusion processes.

High-outlay processing centers are necessary for each of these processes. During the production process, the wafers have to be fed to the individual processing centers.

In the case of known production installations, the wafers are transported between the individual processing centers by conveying systems defined, for example, as roller conveyors. The wafers are usually transported on the rollers of the roller conveyors in cassettes. A plurality of stockers are disposed on the roller conveyors, in each case a certain number of the stockers are disposed as closely as possible to a processing center. The stockers are stationary storage systems in which the wafer cassettes can be deposited and stored preferably under clean-room conditions. For this purpose, the cassettes with the wafers supplied by the conveying system are removed from the rollers of the conveying system and stored in the respective stocker. This process takes place automatically via handling systems, robots or the like. The capacity of the stockers is such that the respective processing center ensures a sufficient supply of wafers at all times.

In accordance with the requirements of a processing center, a number of cassettes with wafers are retrieved from the stocker, and fed to the processing center, at certain time intervals. In this case, the cassettes may be transported to the processing centers via vehicles that are driven by the operating staff. Alternatively, the transportation may take place via driverless, rail-borne or non-rail-borne vehicles. Transportation back into the stocker or directly back to the conveying system can take place in the same way.

The disadvantage here is that storing cassettes with wafers in the stockers is very costly. On the one hand, this results from the fact that the production costs of such stockers are very high. On the other hand, the stockers have a considerable overall size and, in addition, are required in large numbers. Therefore, a considerable surface area is required, and the clean rooms have to be of correspondingly large dimensions. Finally, the operations of the storage cassettes with the wafers in the stockers and retrieving them from the stockers involve a considerable amount of time since the cassettes have to be moved vertically for positioning purposes and, finally, have to be positioned at defined locations in the stocker. This processing outlay is not just considerably costly, but, such a discontinuous wafer-transporting system results in the overall production capacity being adversely effected.

A conveying system of the type mentioned in the introduction is known from U.S. Pat. No. 5,443,346. The conveying system serves for transporting wafers in a clean room. The conveying system contains an inter-bay conveying system via which the wafers are transported in the cassettes. Branching off from the inter-bay conveying system are intra-bay conveying systems via which the wafers are fed to individual processing stations and, following the processing, are transported away from the processing stations again. An intra-bay conveying system has a conveying rail on which a conveying unit is moved. The conveying unit contains, in particular, a positioning robot. The wafers are introduced into the individual processing stations by the positioning robot. The conveying unit carries along a small selection of wafers that are introduced into the respective processing stations. Since the quantity of wafers delivered in the cassettes via the inter-bay conveying system is larger than the number of wafers transported away via the intra-bay conveying system, there is provided, at the transition between the inter-bay conveying system and an intra-bay conveying system, an interface device in which the wafers are stored.

Published, Non-Prosecuted German Patent Application DE 40 17 006 A1 discloses a wafer-conveying system in which different clean rooms are connected to one another by a closed system of conveying channels. In this case, the conveying system may also be configured, in particular, as a transporting store. In the conveying channels, cassettes with wafers are transported onto transporting belts.

The wafers are transported in the conveying channels under clean-room conditions. For this purpose, filtered air flows through the individual conveying channels.

Provided at crossover points between the individual conveying channels are load locks for loading and unloading the cassettes with the wafers.

The loading and unloading operations at the load locks can be carried out manually by the operating staff. Alternatively, a handling unit may be provided for this purpose.

When a load lock is loaded with a cassette, the destination for the cassette is input via a keyboard.

In principle, an automated flow of the wafers may be realized using such a conveying system.

The disadvantage here, however, is that the cassettes have to be loaded into the conveying system individually one after the other, and also have to be removed therefrom individually, via the load locks. If a plurality of cassettes are supplied at one destination, it is therefore necessary to maintain the order in which the cassettes are to be processed further following removal. This limits the flexibility of the conveying system to a considerable extent.

It is also disadvantageous that the individual removal of the cassettes from the load locks is very time-consuming.

However, on account of the high productivity of the processing centers in semiconductor-production installations, it is necessary for a multiplicity of cassettes of wafers to be available at the processing center simultaneously at certain times.

Accordingly, such a conveying system can be only be used in conjunction with a stocker which is assigned to the respective processing center. The cassettes that have been removed individually from the load locks are then stored in the relevant stocker. Depending on requirements, a predetermined number of cassettes are then simultaneously removed and fed to the processing center.

Published, Non-Prosecuted German Patent Application DE 197 29 525 A1 relates to an apparatus for transporting disc-like substrates, for example digital video discs, from starting stations, via a plurality of process stations, to end stations, the process stations carrying out the processing operations, e.g. coating, monitoring, sorting and collection of the substrates. Gripper arms with grippers or suction devices allow the substrates to be transported further from station to station. There are provided a motor/gear unit with a pivoting device and two lifting devices which can be activated separately from one another and interact with gripper arms. The gear mechanism, which forms a conveying station, is disposed at the same distance away from a plurality of stations, for example the supply station, the coating stations, the return station and the checking station. The two lifting devices of the motor/gear unit simultaneously execute, by way of their gripper arms, identical and/or different lifting movements (vertical movements) and pivoting movements that take place at the same time as the latter or following the latter.

Published, Japanese Patent Application JP 08268512 A discloses a storage device for substrates. The storage device has a rack, it being possible for the substrates to be stored on the rack, and retrieved therefrom, by a loading and unloading unit. The substrates are stored intermediately on a loading bed for sorting purposes.

Published, Japanese Patent Application JP 09235010 A describes the construction of a roller conveyor.

Published, Japanese Patent Application JP 10035883 A discloses a transfer unit via which semiconductor products can be positioned reliably and precisely. In this case, a displaceable receiving device feeds the substrates to predetermined containers. The movement is controlled by a camera system.

European Patent Application EP 0 908 931 A2 discloses as prior art, not published before the priority date of the instant application, a conveying apparatus by which semiconductor products can be fed to different processing stations under clean-room conditions. The conveying apparatus contains a cassette in which the semiconductor products are transported under clean-room conditions. The cassette is transported on rails that likewise form a constituent part of the conveying apparatus. The cassette is introduced, via introduction openings, into the respective processing stations in which the semiconductor products are processed.

SUMMARY OF THE INVENTION

It is accordingly an object of the invention to provide a conveying system that overcomes the above-mentioned disadvantages of the prior art devices of this general type, in which it is ensured that the wafers can flow, as far as possible, continuously.

With the foregoing and other objects in view there is provided, in accordance with the invention, in combination with a clean room having a plurality of processing centers for processing wafers, a conveying configuration for transporting the wafers to and in the clean room, the conveying configuration including:

a main conveying system functioning as a transporting store for the wafers; and a plurality of secondary conveying systems branching off from the main conveying system, each of the plurality of secondary conveying systems leading, at a minimum, to one processing center and forms a supply buffer from which a predetermined number of the wafers can be removed and fed to the processing center.

The conveying system according to the invention, which is configured as a transporting store and is intended for transporting wafers, connects a plurality of processing centers for processing the wafers. Secondary conveying systems branch off from the conveying system. In each case one secondary conveying system leads to a certain processing center and forms a supply buffer. From the secondary conveying system, a predetermined number of wafers can optionally be removed, and fed to the processing center, by use of a handling unit.

The conveying system according to the invention ensures that the wafers flow continuously. A considerable advantage resides here in the fact that no stockers are required for storing the wafers.

By virtue of suitable dimensioning of the conveying system, the wafers are stored on the conveying system itself. From the conveying system, the number of wafers that is required in each case is guided directly to the processing center via the respective secondary conveying system. It is particularly advantageous here for the secondary conveying system itself to act as the supply buffer. This is achieved by suitable dimensioning of the secondary conveying system.

In this case, the individual wafers on the secondary conveying system are simultaneously accessible to the handling unit. For example, the secondary conveying system has a predetermined number of roller conveyors, on the top sides of which the wafers in the cassettes rest one behind the other. The handling unit then picks up, at defined receiving locations in each case, the required cassette and feeds it to the processing center. The freely selectable access of the handling unit on the secondary conveying system to the cassettes holding the wafers provides a flexible system for reacting to different wafer demands, in particular, to wafer load peaks.

A further advantage of the conveying system according to the invention is that it is of modular construction and can easily be adapted to changing production outputs.

Other features which are considered as characteristic for the invention are set forth in the appended claims.

Although the invention is illustrated and described herein as embodied in a conveying system, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 2 is a block diagram of a secondary conveying system with a handling unit assigned to it.

DESCRIPTION OF THE PREFERRED EMBODIMENT

Figure 1:
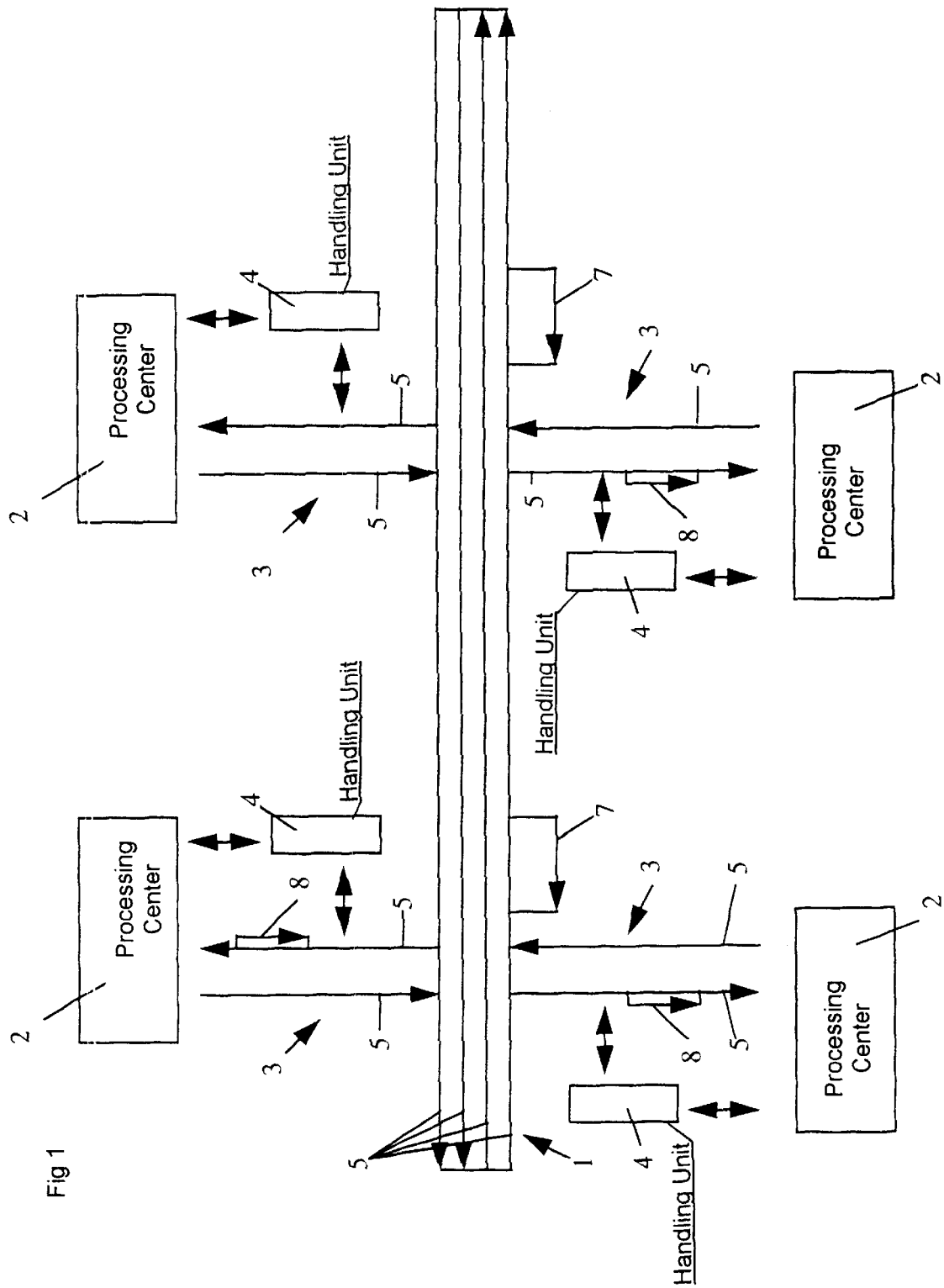
FIG. 1 is a block diagram of a conveying system with a plurality of secondary conveying systems according to the invention.

In all the figures of the drawing, sub-features and integral parts that correspond to one another bear the same reference symbol in each case. Referring now to the figures of the drawing in detail and first, particularly, to FIG. 1 thereof, there is shown an exemplary embodiment of a conveying system 1 for transporting wafers in clean rooms. The conveying system 1 connects a plurality of processing centers 2 for processing the wafers.

The present exemplary embodiment is a production facility for processing the wafers. The production process includes a number of process steps, separate processing centers 2 preferably being provided for each of the process steps. Such process steps are, in particular, various coating processes, the processing centers 2 having ovens provided for this purpose. Furthermore, in separate process steps, photolayers are applied to the individual wafers, separate processing centers 2 also being provided for this purpose. Finally, further processing centers 2 are provided for carrying out etching and diffusion processes. Between the individual process steps, various measuring steps are carried out for monitoring the wafers. It is also possible for different processing centers 2 to be provided for this purpose.

According to the invention, secondary conveying systems 3 branch off from the conveying system 1, in each case one secondary conveying system 3 preferably being assigned to one processing center 2. The secondary conveying system 3 is configured such that in each case a sufficient number of wafers can be removed from the conveying system 1 and fed directly to the processing center 2. In this case, the secondary conveying system 3 acts as a supply buffer. The wafers are likewise transported away from the processing center 2 to the conveying system 1 via the secondary conveying system 3.

Each of the processing centers 2 is assigned a handling unit 4. Wafers delivered on the secondary conveying system 3 can optionally automatically be removed, and fed to the processing center 2, by the handling unit 4.

The conveying system 1 and the secondary conveying systems 3 preferably each have a predetermined number of roller conveyors 5. As can be seen, in particular, from FIG. 2, the wafers are stored in cassettes 6 that rest on the roller conveyors 5 as they are transported. In this case, the cassettes 6 are freely accessible for removal by the handling unit 4.

The secondary conveying systems 3 branch off from crossover points with the conveying system 1. At the crossover points, certain cassettes 6 are specifically directed from the conveying system 1 onto a predetermined secondary conveying system 3. This process takes place automatically without the need for any operating staff. For identifying them, the cassettes 6 expediently bear individual codes, which are identified automatically by code readers. The codes may be formed, in particular, by bar codes that are optically scanned by a bar code reader.

At the crossover points, the cassettes 6 may be discharged through a load lock from the conveying system 1 onto a secondary conveying system 3, for example, by non-illustrated turntables. Transportation from the secondary conveying system 3 back onto the conveying system 1 can take place in the same way.

As is illustrated in FIG. 1, the conveying system 1 may contain a plurality of parallel roller conveyors 5, in each case a predetermined number of the roller conveyors 5 conveying the cassettes 6 with the wafers in one direction and preferably the same number of roller conveyors 5 conveying the cassettes 6 with the wafers in the opposite direction. In this case, for example, the cassettes 6 which are transported on the outer roller conveyors 5 in each case can be discharged through a load lock onto the secondary conveying system 3 which opens out at the roller conveyor 5. In contrast, the cassettes 6 resting on the inner roller conveyors 5 of the conveying system 1 are guided past the secondary conveying system 3. In this case, the cassettes 6 are discharged through the load lock onto the secondary conveying system 3 in that, immediately upstream of the crossover point, the cassette 6 which is to be discharged through the load lock is transported from the inner roller conveyor 5 onto the outer roller conveyors 5 of the conveying system 1. Correspondingly, the cassettes 6 on the secondary conveying system 3 are passed in through the load lock onto the outer roller conveyor 5 of the conveying system 1. The inner roller conveyors 5 serve mainly for storing the cassettes 6 for the secondary conveying system 3. Corresponding transverse connections allow circulation of the cassettes 6. Therefore, the cassettes 6 can be buffer-stored in the order in which they are required by the respective secondary conveying system 3.

In this case, expediently all the roller conveyors 5 of the conveying system 1 and of the secondary conveying systems 3 run in one transporting plane, which facilitates the transfer of the cassettes 6 between the individual roller conveyors 5.

The conveying system 1 forms a transporting store for the wafers. A storage capacity of the transporting store can easily be predetermined essentially by the length of the conveying system 1 and the number of the parallel roller conveyors 5. In addition, it is possible for waiting loops 7 to branch off from the outer roller conveyors 5, the waiting loops 7 likewise being formed by the roller conveyors 5.

Each of the secondary conveying systems 3 have in each case at least one transporting section which feeds the cassettes 6 to the associated processing center 2 and a further transporting section which guides the cassettes 6 from the processing center 2 back to the conveying system 1. The transporting sections each preferably contain one of the roller conveyors 5, the roller conveyors 5 running essentially parallel to one another.

Each of the secondary conveying systems 3 forms a supply buffer, of which the storage capacity can be predetermined by suitable dimensioning of the length of the roller conveyors 5. The storage capacity may, in turn, be increased by secondary waiting loops 8, which are likewise configured from the roller conveyors 5.

As is illustrated in FIG. 2, the cassettes 6 with the wafers, resting on the roller conveyor 5 of the secondary conveying system 3, are fed directly to the associated processing center 2. In this case, a predetermined number of the cassettes 6 rest on the roller conveyor 5 in a freely accessible manner and are located in the operating region of the handling unit 4. If the wafers are required for a production process in the processing center 2, then the number of the cassettes 6 required for this purpose are automatically removed from the roller conveyor 5 of the secondary conveying system 3, and fed to the processing center 2, by the handling unit 4. Since all of the cassettes 6 illustrated in FIG. 2 are located in the operating region of the handling unit 4, the latter can optionally access a certain sub-quantity of the cassettes 6. In this case, the cassettes 6 are identified by the handling unit 4 by reading the codes on the cassettes 6 by the code reader, which is disposed on the handling unit 4 but is not illustrated.

The processing center 2 illustrated in FIG. 2 has a plurality of spaced-apart processing stations 10 standing on a floor 9 of the clean room. The schematic illustration in FIG. 2 is not to scale. The processing centers 2 typically have lengths of a number of meters, the diameters of the wafers typically being up to 30 cm, with the result that the cassettes 6 are considerably smaller than the processing center 2. The process step carried out by the processing center 2 is divided up into a number of sub-steps, in each case one of the processing stations 10 is provided for carrying out one of the sub-steps. For this purpose, in each case a predetermined number of the cassettes 6 with the wafers are fed to the individual processing stations 10 at predetermined times by the handling unit 4. For this purpose, the processing stations 10 have introduction openings 11 via which the wafers are introduced into the processing station 10 or removed therefrom.

It is possible, in principle, for a plurality of the handling units 4 to be provided for supplying the processing stations 10, although just one handling unit 4 is provided in the present exemplary embodiment.

In this case, the handling unit 4 is in the form of a rail-borne load-receiving device 4.

The load-receiving device 4 has a carrier 12 that runs in the vertical direction and on which there is fastened a gripper 13 for receiving the cassettes 6 with the wafers. Provided on the underside of the carrier 12 are wheels 101 which are guided in at least one running rail 14. The running rail 14 runs in the floor 9 of the clean room. It is alternatively possible for the running rail 14 to rest on top of the floor 9. In order to ensure reliable guidance of the load-receiving device 4, there may be provided two parallel running rails 14 in which two parallel rows of wheels 101 on the underside of the load-receiving device 4 are guided.

In the present exemplary embodiment, just one running rail 14 is provided in the floor 9 of the clean room, the wheels 101 of the load-receiving device 4 are guided in the running rail 14. Therefore, the load-receiving device 4 only takes up a small amount of surface area in the clean room. However, the load-receiving device 4 is guided reliably in the running rail 14. The necessary support is achieved by a guide rail 16 that runs parallel to the running rail 14 and is fastened on the underside of a ceiling 15 of the clean room. Rollers 102 on a top side of the carrier 12 of the load-receiving device 4 engage in the guide rail 16. By virtue of the load-receiving device 4 being guided on both sides, in the running rail 14 and in the guide rail 16, it is secured against tilting.

The guide rail 16 may alternatively be disposed on a stationary carrier 103, which may be configured, for example, as a steel framework. The advantage here is that the carrier 12 with the guide rail 16 is isolated from the ceiling 15 of the clean room, with the result that it is not possible for any vibrations to be transmitted to the guide rail 16 from there.

The load-receiving device 4 is driven via a motor (not illustrated) which is controlled via a control unit 100. The load-receiving device 4 is thus displaced without the need for any operating staff.

The actuation of the gripper 13 for handling the cassettes 6 with the wafers is also controlled via the control unit 100 and thus likewise takes place without any operating staff. The cassettes 6 are handled here by the gripper 13. The gripper 13 has a horizontally running gripping arm 17 that can be displaced in the vertical direction on the carrier 12 of the load-receiving device 4. In addition, the gripping arm 17 can be extended and retracted in its longitudinal direction, with the result that it is also possible to change the length of the gripping arm 17. Finally, the gripping arm 17 is disposed on the carrier 12 pivotably in a horizontal plane.

On their top side, the cassettes 6 with the wafers each have a flange 18 projecting from the top side. Disposed on an underside of the gripping arm 17 are gripping tongs 19, of which the movement is likewise controlled via the control unit 100. In order to receive the cassette 6, the gripping tongs 19 grip around the flange 18 of the cassette 6, with the result that the cassette 6 is retained firmly on the gripping arm 17. The gripping tongs 19 may preferably be mounted rotatably on the gripping arm 17, with the result that the cassette 6 can be rotated on the gripping arm 17.

As is illustrated in FIG. 2, the transporting plane in which the cassettes 6, resting on the roller conveyor 5, are delivered to the processing centers 2 is located directly beneath the ceiling 15 of the clean room. This is advantageous, in particular, because, in this way, the conveying system 1 and the secondary conveying systems 3 do not take up any surface area on the floor 9 of the clean room. In addition, this also results in that access to the processing centers 2 by the conveying system 1 and the secondary conveying systems 3 is not obstructed.

In order to remove the cassette 6 from the secondary conveying system 3, first of all the load-receiving device 4 is displaced in the running rail 14 until the gripping arm 17 is located in the region of the cassette 6 which is to be received. In this case, the gripping arm 17 is simultaneously displaced in the vertical direction on the carrier 12 until it is located level with the cassette 6. The gripping arm 17 is then positioned such that the gripping tongs 19 are located above the flange 18 of the cassette 6. The cassette 6 is then picked up. Thereafter, the load-receiving device 4 is moved on in the running rail 14 until the gripper 13 is aligned with the processing station 10 to which the cassette 6 is to be fed. At the same time, the gripper 13 is displaced downwards on the carrier 12, with the result that it is located level with the introduction opening 11 of the processing station 10. If necessary, the cassette 6 is rotated on the gripper 13 so as to have the necessary orientation in relation to the introduction opening 11. It is expedient, however, for the cassettes 6 to have already been delivered on the secondary conveying system 3 in such a position that rotation of the cassette 6 is no longer necessary. The cassette 6 is then introduced into the introduction opening 11.

Once the processing of the cassette 6 in the processing station 10 has been completed, it may be necessary for the cassette 6 then to be fed to a further processing station 10 of the same processing center 2. In this case, the cassette 6 is transported directly via the handling unit 4 rather than via the secondary conveying system 3. The gripper 13, which is preferably already located level with the processing stations 10, receives the cassette 6, whereupon the load-receiving device 4 is displaced directly to the next processing station 10 without the height of the gripper 13 being adjusted. At the next processing station 10, the cassette 6 is introduced into the introduction opening 11 by use of the gripper 13. By virtue of the cassettes 6 being transported between the processing stations 10 of the processing center 2 by the handling unit 4, unnecessary and time-consuming vertical movements of the cassettes 6 in relation to the secondary conveying system 3 are avoided, and this considerably increases the production rate of the facility.

In a further embodiment (not illustrated), the secondary conveying system 3 may have a further buffer in the form of a rack. The rack is expediently located upstream of the processing center 2. The compartments of the rack may be disposed at least partially level with the secondary conveying system 3. In this case, the cassettes 6 with the wafers are removed from the secondary conveying system 3, and stored in predetermined compartments, by the handling unit 4. It is advantageously possible here for individual cassettes 6 already to have been assigned to the individual processing stations 10.

I claim:

1. In combination with a clean room having a plurality of processing centers for processing wafers, a conveying configuration for transporting the wafers to and in the clean room, the conveying configuration comprising:

a main conveying system functioning as a transporting store for the wafers;

a plurality of secondary conveying systems branching off from said main conveying system, each of said plurality of secondary conveying systems leading, at a minimum, to one processing center and forms a supply buffer from which a predetermined number of the wafers can be removed and fed to the processing center; and at least one at least one rail-borne load-receiving device for removing and feeding the wafers from said supply buffer to the processing center, said load-receiving device having:
　a gripper which can be displaced in three directions in space for receiving the wafers; and
　at least one running rail and a substantially vertically running carrier on which said gripper is fastened, said running carrier having an underside with wheels disposed thereon, said wheels being guided in said at least one running rail.

2. The conveying configuration according to claim 1, wherein said main conveying system and each of said secondary conveying systems have a predetermined number of conveyors on which the wafers, accommodated in cassettes, are conveyed, said conveyors being selected from the group consisting of belt conveyors and roller conveyors.

3. The conveying configuration according to claim 1, wherein said secondary conveying systems branch off from said main conveying system at crossover points, at said crossover points the cassettes are directed automatically onto one of said main conveying system and one of said secondary conveying systems.

4. The conveying configuration according to claim 3, wherein said main conveying system and said secondary conveying systems run in one transporting plane.

5. The conveying configuration according to claim 1, wherein said main conveying system has a length and a storage capacity being determined by said length.

6. The conveying configuration according to claim 5, including waiting loops branching off from said main conveying system.

7. The conveying configuration according to claim 1, wherein said secondary conveying systems each have a first transporting section transporting the wafers from said main conveying system to the processing center and a second transporting section transporting the wafers from the processing center to said main conveying system.

8. The conveying configuration according to claim 1, wherein each of said secondary conveying systems has a given length and said supply buffer defined by each of said secondary conveying systems has a storage capacity predetermined by said given length of a respective secondary conveying system.

9. The conveying configuration according to claim 8, including waiting loops branching off from said secondary conveying systems.

10. The conveying configuration according to claim 1, wherein the clean room has a floor and said at least one running rail runs in the floor of the clean room.

11. The conveying configuration according to claim 1, wherein said substantially vertically running carrier has a top side and said rail-borne load-receiving device has at least one guide rail guiding said substantially vertically running carrier.

12. The conveying configuration according to claim 11, wherein the clean room has a ceiling and said at least one guide rail is connected to the ceiling of the clean room.

13. The conveying configuration according to claim 1, wherein the wafers are mounted rotatably on the gripper.

14. The conveying configuration according to claim 1, including a control unit for controlling a movement of said rail-borne load-receiving device.

15. The conveying configuration according to claim 11, wherein said rail-borne load-receiving device has a stationary carrier and said at least one guide rail is installed on said stationary carrier.

16. The conveying configuration according to claim 1, wherein the clean room has a ceiling and a floor, a transporting plane is located just beneath the ceiling, and the processing centers are disposed on the floor of the clean room.

17. The conveying configuration according to claim 1, wherein the processing center has a plurality of processing stations for processing the wafers, and the wafers are transported between the processing stations of the processing center via said rail-borne load-receiving device.

18. The conveying configuration according to claim 1, wherein said rail borne load-receiving device is a plurality of load-receiving devices provided for each of the processing centers.

* * * * *